US011443927B2

(12) United States Patent
Hirayama

(10) Patent No.: US 11,443,927 B2
(45) Date of Patent: Sep. 13, 2022

(54) PLASMA TREATMENT DEVICE

(71) Applicants: TOKYO ELECTRON LIMITED, Tokyo (JP); TOHOKU UNIVERSITY, Miyagi (JP)

(72) Inventor: Masaki Hirayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 329 days.

(21) Appl. No.: 16/464,812

(22) PCT Filed: Nov. 16, 2017

(86) PCT No.: PCT/JP2017/041305
§ 371 (c)(1),
(2) Date: May 29, 2019

(87) PCT Pub. No.: WO2018/101065
PCT Pub. Date: Jun. 7, 2018

(65) Prior Publication Data
US 2019/0295828 A1 Sep. 26, 2019

(30) Foreign Application Priority Data
Nov. 30, 2016 (JP) .............................. JP2016-232471

(51) Int. Cl.
*H01L 21/326* (2006.01)
*C23C 16/00* (2006.01)
(Continued)

(52) U.S. Cl.
CPC .. *H01J 37/32935* (2013.01); *H01J 37/32082* (2013.01); *H01J 37/32449* (2013.01);
(Continued)

(58) Field of Classification Search
CPC ........... H01J 37/32082; H01J 37/32935; H01J 37/32522; H01J 37/32192;
(Continued)

(56) References Cited

U.S. PATENT DOCUMENTS

2005/0257743 A1* 11/2005 Koshiishi .......... H01J 37/32577
118/723 E
2006/0169410 A1* 8/2006 Maeda .............. H01J 37/32935
156/345.28
(Continued)

FOREIGN PATENT DOCUMENTS

JP 07142449 A 6/1995
JP 9312268 A 12/1997
(Continued)

*Primary Examiner* — Luz L Alejandro Mulero
(74) *Attorney, Agent, or Firm* — Nath, Goldberg & Meyer; Jerald L. Meyer; Tanya E. Harkins

(57) ABSTRACT

A plasma treatment device includes: a chamber body including a chamber defined therein; a gas supply part that supplies a processing gas into the chamber; a stage disposed within the chamber; an upper electrode having a circular surface that faces the stage; a conductor connected to the upper electrode; a high-frequency power supply that generates a first high-frequency wave; a bias power supply that applies a second high-frequency wave or a direct current bias voltage to the upper electrode; an annular insulating ring extending along an outer edge of the circular surface; a waveguide through which electromagnetic waves generated around the conductor based on the first high-frequency wave propagate, the waveguide being connected to the annular insulating ring outside the upper electrode; and a controller that controls the second high-frequency wave or the direct current bias voltage to be applied to the upper electrode.

2 Claims, 7 Drawing Sheets

(51) Int. Cl.
*H01J 37/32* (2006.01)
*H01L 21/67* (2006.01)
*H05H 1/46* (2006.01)
*H01L 21/3065* (2006.01)

(52) U.S. Cl.
CPC .. *H01J 37/32522* (2013.01); *H01J 37/32541* (2013.01); *H01L 21/3065* (2013.01); *H01L 21/67017* (2013.01); *H05H 1/46* (2013.01); H01J 2237/24585 (2013.01)

(58) Field of Classification Search
CPC ........... H01J 37/32201; H01J 37/32211; H01J 37/3222; H01J 37/32229; H01J 37/32238; H01J 37/32247; H01J 37/32256; H01J 37/32266; H01J 37/32275; H01J 37/32284; H01J 37/32293; H01J 37/32302; H01J 37/32311
See application file for complete search history.

(56) References Cited

U.S. PATENT DOCUMENTS

| | | | |
|---|---|---|---|
| 2007/0235135 A1* | 10/2007 | Nishio | H01L 21/6833 156/345.28 |
| 2008/0223522 A1* | 9/2008 | Kobayashi | H01J 37/32935 156/345.25 |
| 2009/0025879 A1* | 1/2009 | Rauf | H01J 37/16 156/345.48 |
| 2009/0065480 A1* | 3/2009 | Ohmi | H05H 1/46 427/575 |
| 2009/0236214 A1* | 9/2009 | Janakiraman | C23C 16/5096 204/164 |
| 2016/0281225 A1* | 9/2016 | Kim | H01J 37/32633 |

FOREIGN PATENT DOCUMENTS

| | | |
|---|---|---|
| JP | 2007281205 A | 10/2007 |
| JP | 200921256 A | 1/2009 |

\* cited by examiner

PLASMA TREATMENT DEVICE

This is a National Phase Application filed under 35 U.S.C. 371 as a national stage of PCT/JP2017/041305, filed Nov. 16, 2017, an application claiming the benefit of Japanese Application No. 2016-232471, filed Nov. 30, 2016, the content of each of which is hereby incorporated by reference in its entirety.

TECHNICAL FIELD

Embodiments of the present disclosure relate to a plasma treatment device.

BACKGROUND

In the manufacture of a semiconductor device or the like, a plasma treatment is performed on a workpiece by exposing the workpiece to plasma. In such a plasma treatment, from the viewpoint of reducing the processing time and reducing damage to the workpiece, it is desirable to use plasma with high density and low electron temperature.

In order to generate plasma with high density and low electron temperature, there is a method that uses a high-frequency wave in the very-high-frequency (VHF) band or the ultra-high-frequency (UHF) band as electric power for plasma generation. For example, Patent Document 1 discloses a parallel plate-type plasma treatment device that generates plasma by applying a high-frequency wave ranging from 20 MHz to 200 MHz to a cathode electrode that is used as a lower electrode. In addition, Patent Document 2 discloses a parallel plate-type plasma treatment device that generates plasma by applying high-frequency power of 100 MHz to a susceptor that is used as a lower electrode.

PRIOR ART DOCUMENTS

Patent Documents

Patent Document 1: Japanese Unexamined Patent Application Publication No. 9-312268
Patent Document 2: Japanese Unexamined Patent Application Publication No. 2009-021256

When high-frequency waves in the VHF band or the UHF band are applied to an electrode, electromagnetic waves generated by the high-frequency waves propagate as surface waves on the surface of the electrode. These surface waves interfere with each other to generate a voltage intensity distribution on the surface of the electrode. This deteriorates the uniformity of plasma density. In particular, in a case where the plasma treatment device is configured such that the surface waves propagate from the outer edge of the surface of a circular electrode towards the center thereof, the surface waves interfere with each other in the vicinity of the center of the surface of the electrode. Thus, the density of plasma generated radially inward of the electrode surface is higher than the density of plasma generated radially outward of the electrode surface. In contrast, in the plasma treatment device disclosed in Patent Document 1, in order to improve the uniformity of the plasma density, the distance between an upper electrode and a lower electrode is reduced toward the outer edge by increasing the thickness of the lower electrode toward the outer edge of the lower electrode.

However, in the device disclosed in Patent Document 1, the shape of the lower electrode is fixed, which makes it difficult to flexibly control the density distribution of plasma according to process conditions. Therefore, in this technical field, there is a demand for a plasma treatment device capable of flexibly controlling the density distribution of plasma even when high-frequency waves in the VHF band or the UHF band are used as high-frequency waves for plasma generation.

SUMMARY

A plasma treatment device according to an aspect includes: a chamber body including a chamber defined therein; a gas supply part configured to supply a processing gas into the chamber; a stage disposed within the chamber; an upper electrode having a circular surface that faces the stage via an internal space of the chamber; a conductor connected to the upper electrode; a high-frequency power supply configured to generate a first high-frequency wave having a frequency ranging from 100 MHz to 1,000 MHz, the high-frequency power supply being coupled to the upper electrode via the conductor; a bias power supply configured to apply a second high-frequency wave or a direct current (DC) bias voltage to the upper electrode, the second high-frequency wave having a frequency lower than a frequency of the first high-frequency wave; an annular insulating ring provided to extend along an outer edge of the circular surface of the upper electrode; a waveguide through which electromagnetic wave generated around the conductor based on the first high-frequency wave propagates, the waveguide being connected to the annular insulating ring outside the upper electrode; and a controller configured to control the second high-frequency wave or the DC bias voltage to be applied to the upper electrode.

In the plasma treatment device according to one aspect, as the first high-frequency wave are applied to the upper electrode through the conductor, the electromagnetic waves are generated around the conductor. The electromagnetic waves pass through the waveguide and the insulating ring and propagate along the annular surface of the upper electrode in the form of surface waves directed towards the center of the upper electrode from the outer edge of the annular surface of the upper electrode. The surface waves are gradually attenuated while transmitting energy to plasma generated in the internal space of the chamber. The attenuation coefficient of the surface waves depends on the thickness of a sheath formed between the plasma and the annular surface of the upper electrode. The thickness of the sheath can be controlled by the bias voltage applied to the upper electrode. For example, as the absolute value of a negative bias voltage applied to the upper electrode increases, the thickness of the sheath is increased and the attenuation coefficient of the surface waves is decreased. In contrast, as the absolute value of the negative bias voltage applied to the upper electrode decreases, the thickness of the sheath is decreased and the attenuation coefficient of the surface waves is increased. In the plasma treatment device according to another aspect, by controlling the second high-frequency waves or the DC bias voltage to be applied to the upper electrode by the control part, it is possible to control the attenuation coefficient of the surface waves. Thus, it is possible to change, among the surface waves that have been introduced from the outer edge of the upper electrode, a ratio of energy of the surface waves reaching the center of the upper electrode in the radial direction. Therefore, according to the plasma treatment device of an embodiment, it is possible to flexibly control the density distribution of plasma in the radial direction.

In some embodiments, the chamber body may include a sidewall, and a choke part may be provided in the sidewall.

The choke part may be formed to extend in an annular shape around a central axis of the chamber body and may be configured to suppress electromagnetic waves propagating between the stage and the sidewall.

In some embodiments, the choke part may include a first portion that extends in a radial direction of the chamber body and a second portion that extends in a direction parallel to the central axis.

In some embodiments, a sum of a length of the first portion in the radial direction and a length of the second portion in the direction parallel to the central axis may be set to a length that is adapted to eliminate the electromagnetic waves propagating between the stage and the sidewall.

In some embodiments, a plurality of sensors configured to detect parameters corresponding to heat fluxes directed toward the upper electrode from the internal space may be provided in the upper electrode. The plurality of sensors may be disposed at different positions in the upper electrode in the radial direction, respectively, and the controller may be configured to control the second high-frequency waves or the DC bias voltage based on detection results obtained by the plurality of sensors.

In some embodiments, the upper electrode may include: a main body having a coolant flow path formed therein; and a shower plate disposed under the main body and having the annular surface, the shower plate having a plurality of gas discharge holes formed therein. Each of the plurality of sensors may be configured to output an output signal corresponding to a difference between a temperature of the main body and a temperature of the shower plate, and the controller may be configured to control the second high-frequency waves or the DC bias voltage based on the output signal.

According to some embodiments of the present disclosure, it is possible to provide a plasma treatment device capable of flexibly controlling the density distribution of plasma.

DETAILED DESCRIPTION

Figure 1:
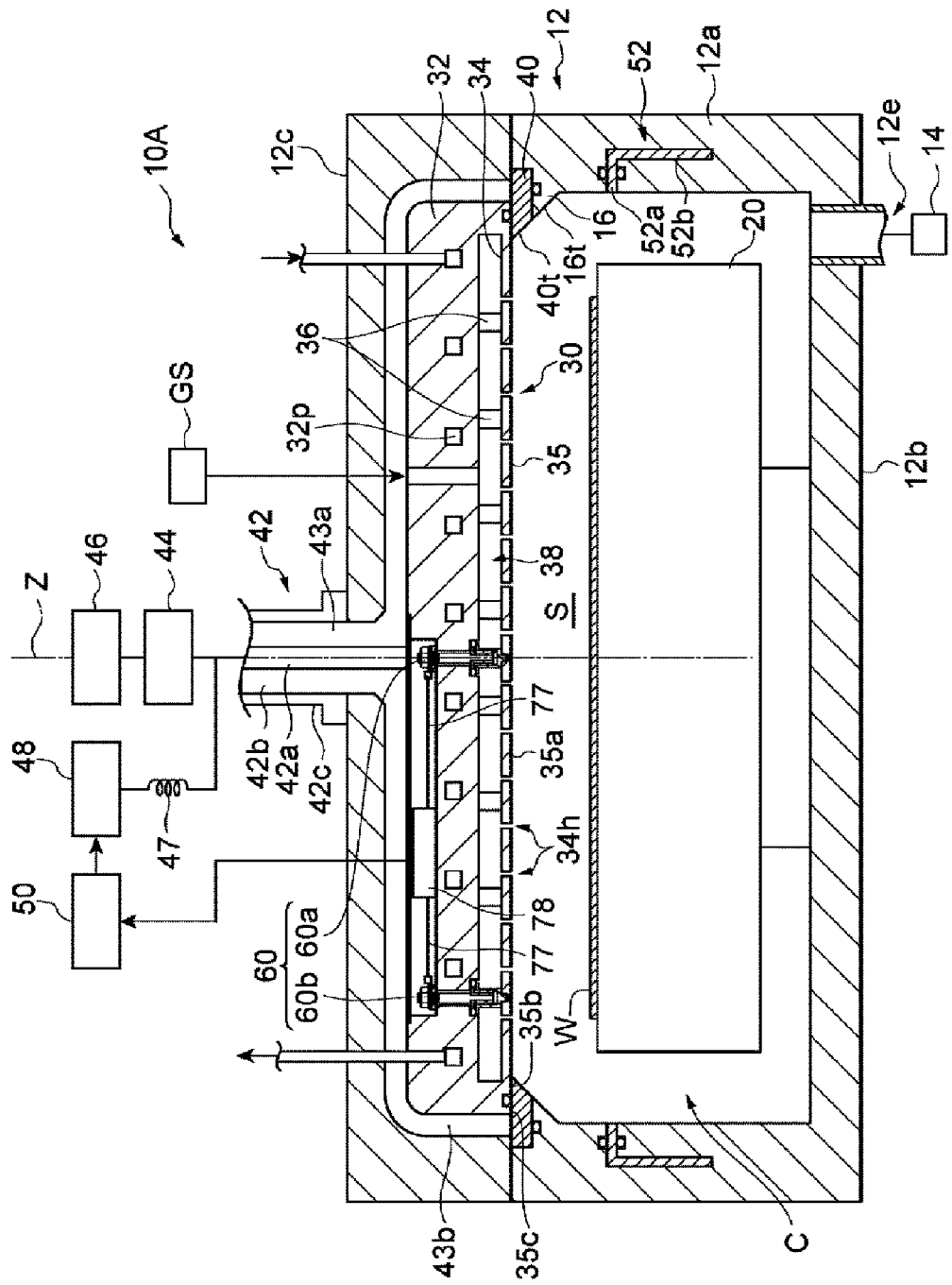
FIG. 1 is a vertical cross-sectional view illustrating a plasma treatment device according to an embodiment.

Hereinafter, various embodiments of the present disclosure will be described in detail with reference to the drawings. Throughout the drawings, the same or similar parts are denoted by the same reference numerals and duplicate descriptions thereof will be omitted. Further, dimension ratios in the respective drawing do not necessarily coincide with actual dimension ratios.

A plasma treatment device according to an embodiment will be described. FIG. 1 is a cross-sectional view schematically illustrating a plasma treatment device 10A according to an embodiment. The plasma treatment device 10A includes a chamber body 12. The chamber body 12 may be made of aluminum, and has an anodized surface. The chamber body 12 provides a chamber C defined therein. The chamber body 12 is grounded.

In an embodiment, the chamber body 12 may include a sidewall 12a, a bottom portion 12b, and a lid portion 12c. The sidewall 12a has a substantially cylindrical shape. A central axis of the sidewall 12a coincides with a central axis Z of the chamber body 12. The bottom portion 12b is connected to a lower end of the sidewall 12a. An exhaust port 12e is formed in the bottom portion 12b. An exhaust device 14 such as a vacuum pump is connected to the exhaust port 12e. The exhaust device 14 exhausts gas in the chamber body 12 such that an internal pressure of the chamber body 12 becomes a predetermined pressure. The lid portion 12c is connected to an upper end of the sidewall 12a so as to close an opening formed in an upper portion of the sidewall 12a.

A stage 20 is provided in a lower portion of the chamber C. A workpiece W is supported on an upper surface of the stage 20.

The plasma treatment device 10A further includes an upper electrode 30. The upper electrode 30 has a substantially disk shape. The upper electrode 30 is provided above the stage 20, and is arranged to face the stage 20 via an internal space S of the chamber C. In an embodiment, the upper electrode 30 may include a main body 32 and a shower plate 34.

The main body 32 has a substantially disk shape, and may be made of an aluminum alloy. In an embodiment, a coolant flow path 32p may be formed inside the main body 32. A coolant inlet pipe and a coolant outlet pipe are connected to the coolant flow path 32p. The coolant inlet pipe and the coolant outlet pipe are connected to a chiller unit. Coolant is supplied from the chiller unit to the coolant flow path 32p via the coolant inlet pipe and circulates so as to return from the coolant flow path 32p to the chiller unit via the coolant outlet pipe. The upper electrode 30 is configured to be controlled to have a predetermined temperature by circulating an appropriate coolant such as cooling water or the like through the coolant flow path 32p.

The shower plate 34 is provided below the main body 32. The shower plate 34 has a substantially shaped like a disk, and may be made of an aluminum alloy. A plurality of through-holes 34h, namely a plurality of gas discharge holes are formed in the shower plate 34. A surface 35 facing the upper surface of the stage 20 in the shower plate 34 is exposed in the space S. The surface 35 includes an inner portion 35a and an outer portion 35b. The inner portion 35a is a substantially circular region located above the stage 20. The outer portion 35b is a region located outward of the stage 20 in the radial direction of the surface 35, and is an annular region surrounding the outer side of the inner portion 35a. An outer edge 35c of the surface 35 is positioned at the outermost periphery of the outer portion 35b.

A plurality of spacers 36 are provided between the shower plate 34 and the main body 32. The shower plate 34 and the main body 32 are separated from each other in the direction of the central axis Z via the plurality of spacers 36. A gas diffusion chamber 38 communicating with the plurality of through-holes 34h is formed between the main body 32 and the shower plate 34. The gas diffusion chamber 38 is connected to a gas supply part GS provided outside the chamber body 12. The gas supply part GS includes a gas source, a flow rate controller, and a valve. The gas source supplies a processing gas into the gas diffusion chamber 38 via the flow rate controller and the valve. The processing gas supplied from the gas supply part GS to the gas diffusion chamber 38 is supplied into the space S via the plurality of through-holes 34h.

An annular supporting portion 16 is formed in the upper portion of the sidewall 12a so as to project radially inwards from the inner surface of the sidewall 12a. That is to say, an inner diameter of a portion in which the supporting portion 16 of the sidewall 12a is formed is smaller than that of a portion in which the supporting portion 16 is not formed. The supporting portion 16 may have an inclined surface 16t that is inclined so as to be oriented inward in the radial direction as it goes upwards.

The plasma treatment device 10A further includes an insulating ring 40. The insulating ring 40 is made of an insulator such as alumina. The insulating ring 40 is an annular body extending around the central axis Z, and is supported on the supporting portion 16. The insulating ring 40 extends along the outer edge 35c of the surface 35, and supports the upper electrode 30 from below.

In an embodiment, the insulating ring 40 may have an inclined surface 40t that is inclined so as to be oriented inward in the radial direction as it goes upwards. The inclined surface 40t of the insulating ring 40 and the inclined surface 16t of the supporting portion 16 may have the same inclination angle. The inclined surface 40t and the inclined surface 16t may be positioned on the same straight line when viewed in the vertical cross section passing through the central axis Z. O-rings are provided between the insulating ring 40 and the upper electrode 30 and between the insulating ring 40 and the supporting portion 16, respectively. As a result, the airtightness of the chamber C is secured.

The plasma treatment device 10A further includes a coaxial waveguide 42. The coaxial waveguide 42 includes an inner conductor 42a and an outer conductor 42c. One end of the inner conductor 42a is connected to the main body 32. The other end of the inner conductor 42a is connected to a high-frequency power supply 46 via a matcher 44. The high-frequency power supply 46 is a power supply configured to generate first high-frequency waves for plasma generation, which have a frequency ranging from 100 MHz to 1000 MHz. The first high-frequency waves are applied to the upper electrode 30 via the matcher 44 and the inner conductor 42a. The matcher 44 is configured to adjust a load impedance of the high-frequency power supply 46.

The other end of the inner conductor 42a is also coupled to a bias power supply 48 via a low-pass filter 47. The bias power supply 48 generates bias output waves that are supplied to the upper electrode 30. The output waves generated by the bias power supply 48 are second high-frequency waves having a frequency lower than that of the first high-frequency waves. The second high-frequency waves are high-frequency waves having a positive or negative direct current component, and may have a frequency of 500 kHz. The bias power supply 48 applies the second high-frequency waves to the upper electrode 30 via the low-pass filter 47 and the inner conductor 42a. That is to say, the second high-frequency waves are applied to the upper electrode 30 while being superimposed on the first high-frequency waves. The bias power supply 48 may apply a direct current (DC) bias voltage to the upper electrode 30 instead of the second high-frequency waves.

Further, the outer conductor 42c of the coaxial waveguide 42 is connected to the lid portion 12c. The inner conductor 42a and the outer conductor 42c constitute a portion of a waveguide 42b to be described later.

The plasma treatment device 10 further includes the waveguide 42b. The waveguide 42b propagates electromagnetic waves generated around the inner conductor 42a to the space S on the basis of the first high-frequency waves provided from the high-frequency power supply 46. The waveguide 42b may be made of an insulator. The waveguide 42b includes a first portion 43a and a second portion 43b, which are continuous with each other. The first portion 43a extends between the inner conductor 42a and the outer conductor 42c. The second portion 43b extends between the upper electrode 30 and the lid portion 12c, and is connected to the insulating ring 40 outside the upper electrode 30.

The plasma treatment device 10A further includes a control part 50. The control part 50 may include a computer device that may include a processor or a storage part. The control part 50 is connected to the bias power supply 48. The control part 50 sends a control signal to the bias power supply 48 so as to control the bias voltage (second high-frequency waves or DC bias voltage) provided from the bias power supply 48. In addition to controlling the bias power supply 48, the control part 50 may have a function of controlling each part of the plasma treatment device 10A. For example, the control part 50 may supply control signals to the high-frequency power supply 46, the exhaust device 14, and the gas supply part GS so as to control the first high-frequency waves supplied to the upper electrode 30, the internal pressure of the chamber body 12, and the type and flow rate of each gas supplied into the chamber body 12.

Figure 2:
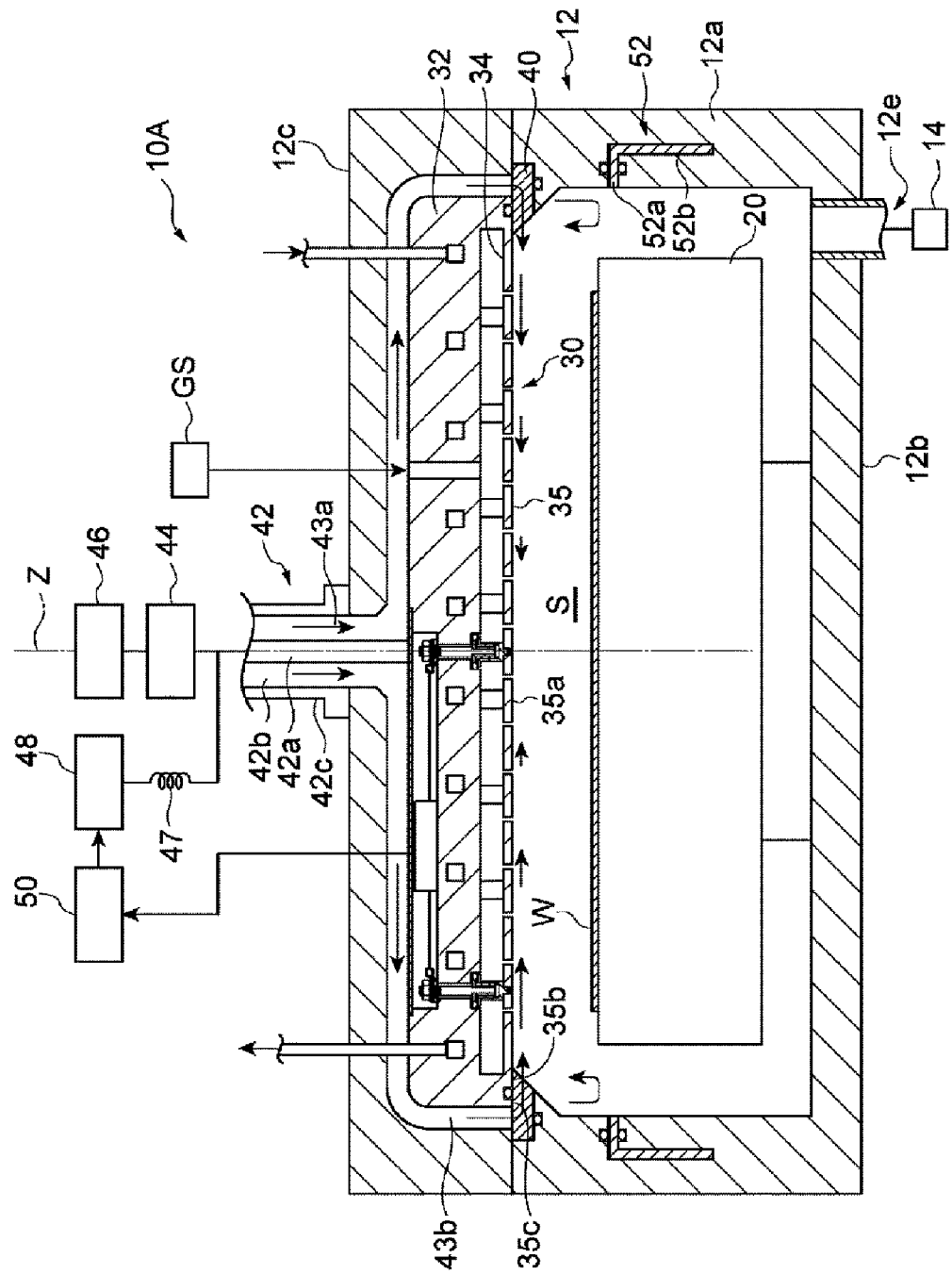
FIG. 2 is a view for explaining a propagation path of electromagnetic waves.

The function of the plasma treatment device 10A will be described with reference to FIG. 2. When the first high-frequency waves are applied from the high-frequency power supply 46 to the upper electrode 30, electromagnetic waves are generated around the inner conductor 42a. The electromagnetic waves generated around the inner conductor 42a propagate towards the insulating ring 40 while being reflected inside the waveguide 42b, as indicated by arrows in FIG. 2. The insulating ring 40 receives the electromagnetic waves propagated through the waveguide 42b, and transmits the same to the space S. The electromagnetic waves transmitted through the insulating ring 40 propagate as surface waves that are directed from the outer edge 35c of the surface 35 to the center of the surface 35 along a sheath formed between plasma generated in the space S and the surface 35. That is to say, the surface waves propagate along the surface 35 made of metal. As indicated by different lengths of arrows in FIG. 2, the surface waves are gradually attenuated while transmitting energy to the plasma generated in the space S as they go to the inner side of the surface 35 in the radial direction.

The attenuation coefficient of the surface waves depends on the thickness of the sheath. The thickness of the sheath can be controlled by the bias voltage applied to the upper electrode 30. For example, the thickness of the sheath is increased as the absolute value of a negative bias voltage applied to the upper electrode 30 increases. When the thickness of the sheath increases, the attenuation coefficient of the surface waves decreases. In contrast, the thickness of the sheath is decreased as the absolute value of the negative bias voltage applied to the upper electrode decreases. When the thickness of the sheath decreases, the attenuation coefficient of the surface waves increases. In the plasma treatment device 10A, the attenuation coefficient of the surface waves may be changed by controlling the second high-frequency waves or the DC bias voltage applied to the upper electrode 30 by the control part 50. Thus, it is possible to change, among the surface waves that are being introduced from the outer edge 35c of the upper electrode 30, a ratio of the energy of the surface waves reaching the center of the surface 35 in the radial direction. As a result, the degree of interference of the surface waves can be adjusted, which makes it possible to flexibly control the density distribution of the plasma in the radial direction.

Referring to FIG. 1, the plasma treatment device 10A may further include a choke part 52. The choke part 52 has a function of suppressing electromagnetic waves propagating between the stage 20 and the sidewall 12a. That is to say, the choke part 52 suppresses generation of unnecessary plasma between the stage 20 and the sidewall 12a. The choke part 52 may be made of a material having high heat resistance, such as ceramics made of alumina, aluminum nitride, or the like, or quartz, and has an annular shape centered at the central axis Z.

As illustrated in FIG. 1, the choke part 52 may include a first portion 52a extending along the radial direction of the chamber body 12 and a second portion 52b extending along a direction parallel to the central axis Z. The first portion 52a and the second portion 52b are continuous with each other. The sum of a length of the first portion 52a of the choke part 52 in the radial direction and a length of the second portion 52b in the direction parallel to the central axis Z is set to such a length as to remove the electromagnetic waves propagating between the stage 20 and the sidewall 12a. Specifically, the sum of the length of the first portion 52a of the choke part 52 in the radial direction and the length of the second portion 52b in the direction parallel to the central axis Z is about ¼ of the wavelength of the electromagnetic waves propagating inside the choke part 52. By setting the length of the choke part 52 to about ¼ of the wavelength of the electromagnetic waves propagating inside the choke part 52, the impedance of the choke part 52 reaches an infinite value as viewed from the insulating ring 40. Thus, it is possible to eliminate the electromagnetic waves propagating between the stage 20 and the sidewall 12a by the choke part 52. In some embodiments, in order to make a position of an end surface of the choke part 52 coincide with a position of an electrical short-circuit surface, the length of the choke part 52 may be designed to be slightly longer than ¼ of the wavelength of the electromagnetic waves propagating inside the choke part 52. In some embodiments, the choke part 52 may extend only in the radial direction, and the length of the choke part 52 in the radial direction may be set to such a length as to eliminate the electromagnetic waves propagating between the stage 20 and the sidewall 12a, namely about ¼ of the wavelength of the electromagnetic waves propagating inside the choke part 52. In addition, an O-ring may be provided between the choke part 52 and the sidewall 12a.

In an embodiment, the plasma treatment device 10A may further include a plurality of sensors 60. The plurality of sensors 60 are provided at different positions in the radial direction of the upper electrode 30. In the embodiment illustrated in FIG. 1, two sensors 60a and 60b as the plurality of sensors 60 are installed in the upper electrode 30. The sensor 60a is provided at the center position of the upper electrode 30 in the radial direction, namely on the central axis Z. The sensor 60b is provided radially outward of the sensor 60a. The plurality of sensors 60 detect parameters corresponding to heat fluxes directed from the space S to the upper electrode 30.

Ions and high-energy electrons in the plasma generated in the space S are incident on the shower plate 34 and heat the shower plate 34. The heat fluxes generated when ions and electrons are incident on the shower plate 34 are proportional to the density of the plasma generated in the space S. Therefore, by detecting the distribution of the heat fluxes directed from the space S to the upper electrode 30 using the plurality of sensors 60, it is possible to estimate the density distribution of the plasma generated in the space S.

Figure 3:
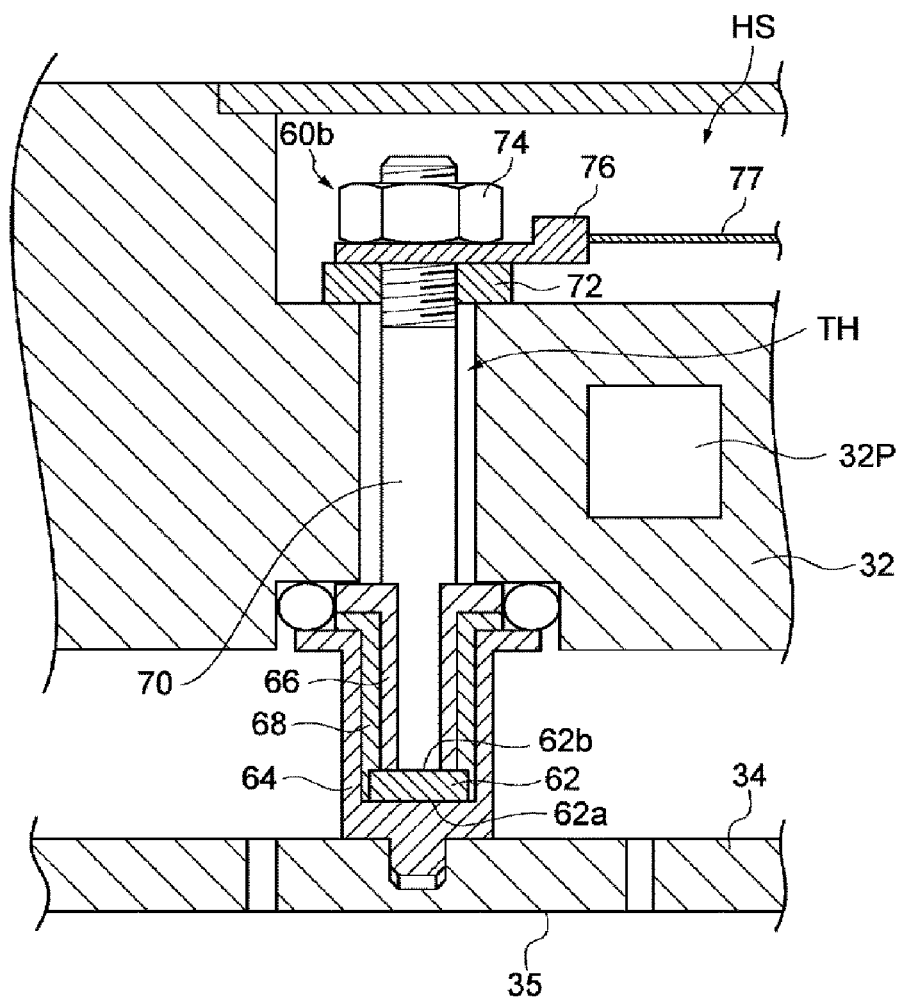
FIG. 3 is an enlarged view of a sensor.

The plurality of sensors 60 acquire the parameters corresponding to the heat fluxes by measuring a difference in temperature between the main body 32 and the shower plate 34. Hereinafter, the plurality of sensors 60 will be described in detail with reference to FIG. 3. FIG. 3 is an enlarged cross-sectional view of the sensor 60b. The sensor 60a has the same configuration as the sensor 60b.

Referring to FIG. 3, the sensor 60b includes a Peltier element 62. The Peltier element 62 includes a first electrode 62a and a second electrode 62b, and outputs a voltage corresponding to a difference in temperature between the first electrode 62a and the second electrode 62b due to the Seebeck effect. The first electrode 62a is in contact with the shower plate 34 via a metal pipe 64. The metal pipe 64 may be made of a metal such as stainless steel. Therefore, the first electrode 62a is thermally connected to the shower plate 34, and is electrically connected to the shower plate 34 and the main body 32. In order to obtain the temperature of the surface 35 more accurately, as illustrated in FIG. 3, the metal pipe 64 may be in contact with the shower plate 34 at a position lower than a height position of the upper surface of the shower plate 34, namely at a position close to the surface 35. Further, an O-ring may be provided between an upper portion of the metal pipe 64 and the main body 32.

The second electrode 62b is in contact with the main body 32 via an insulating pipe 66. The insulating pipe 66 is made of an insulating material having high thermal conductivity, such as aluminum nitride. Therefore, the second electrode 62b is thermally connected to the main body 32, but is electrically insulated from the main body 32. A filling material 68 made of an insulator having low thermal conductivity, such as epoxy resin, is filled between the metal pipe 64 and the insulating pipe 66. Thus, the metal pipe 64 and the insulating pipe 66 are electrically and thermally insulated from each other.

Further, a metal rod 70 is connected to the second electrode 62b. The metal rod 70 is made of a metal having high thermal conductivity, such as copper. In an embodiment, a concave portion is formed in a portion of the upper surface of the main body 32. The concave portion may define a housing space HS that accommodates a portion of the plurality of sensors 60 and a voltage measurement circuit 78 (to be described later). The metal rod 70 extends to the housing space HS through a through-hole TH formed in the main body 32. An upper portion of the metal rod 70 is fastened to the main body 32 by a nut 74. An insulating washer 72 is provided between the nut 74 and the upper surface of the main body 32. The insulating washer 72 is made of an insulator such as aluminum nitride. A crimping terminal 76 is provided between the insulating washer 72 and the nut 74. The crimping terminal 76 is electrically coupled to the second electrode 62b via the metal rod 70, but is electrically insulated from the main body 32.

As illustrated in FIG. 1, the voltage measurement circuit 78 may be provided in the housing space HS. The voltage measurement circuit 78 is electrically coupled to the crimping terminal 76 of each of the plurality of sensors 60 via a wire 77. The voltage measurement circuit 78 measures a voltage between the wire 77 and the main body 32, namely an output voltage of the Peltier element 62. The voltage measurement circuit 78 sends an output signal corresponding to an output voltage from each of the plurality of sensors 60 to the control part 50.

The control part 50 controls the bias power supply 48 on the basis of the output signal from the voltage measurement circuit 78. For example, when the output voltage from the sensor 60a is higher than that from the sensor 60b, the control part 50 estimates that the density of plasma generated radially inward of the space S is higher than the density of plasma generated radially outward of the space S. Therefore, in an exemplary embodiment, the control part 50 controls the bias power supply 48 such that the absolute value of the negative bias voltage to be applied to the upper electrode 30 from the bias power supply 48 becomes smaller. Thus, the sheath becomes thinner and the attenuation coefficient of the surface waves increases. Therefore, among the surface waves supplied from the outer edge 35c of the surface 35, the ratio of energy of the surface waves reaching the center position of the surface 35 in the radial direction becomes smaller. As a result, the density of the plasma generated radially inward of the space S is decreased, thus improving the in-plane uniformity of plasma. In contrast, when the output voltage from the sensor 60a is lower than that from the sensor 60b, the control part 50 estimates that the density of plasma generated radially inward of the space S is lower than the density of plasma generated radially outward of the space S. Therefore, in this case, the control part 50 controls the bias power supply 48 such that the absolute value of the negative bias voltage to be applied to the upper electrode 30 from the bias power supply 48 becomes larger. As a result, the sheath becomes thicker and the attenuation coefficient of the surface waves is decreased. Therefore, among the surface waves supplied from the outer edge 35c of the surface 35, the ratio of energy of the surface waves reaching the center position of the surface 35 in the radial direction becomes larger. As a result, the density of plasma generated radially inward of the space S is increased, thus improving the in-plane uniformity of plasma density.

Figure 4:
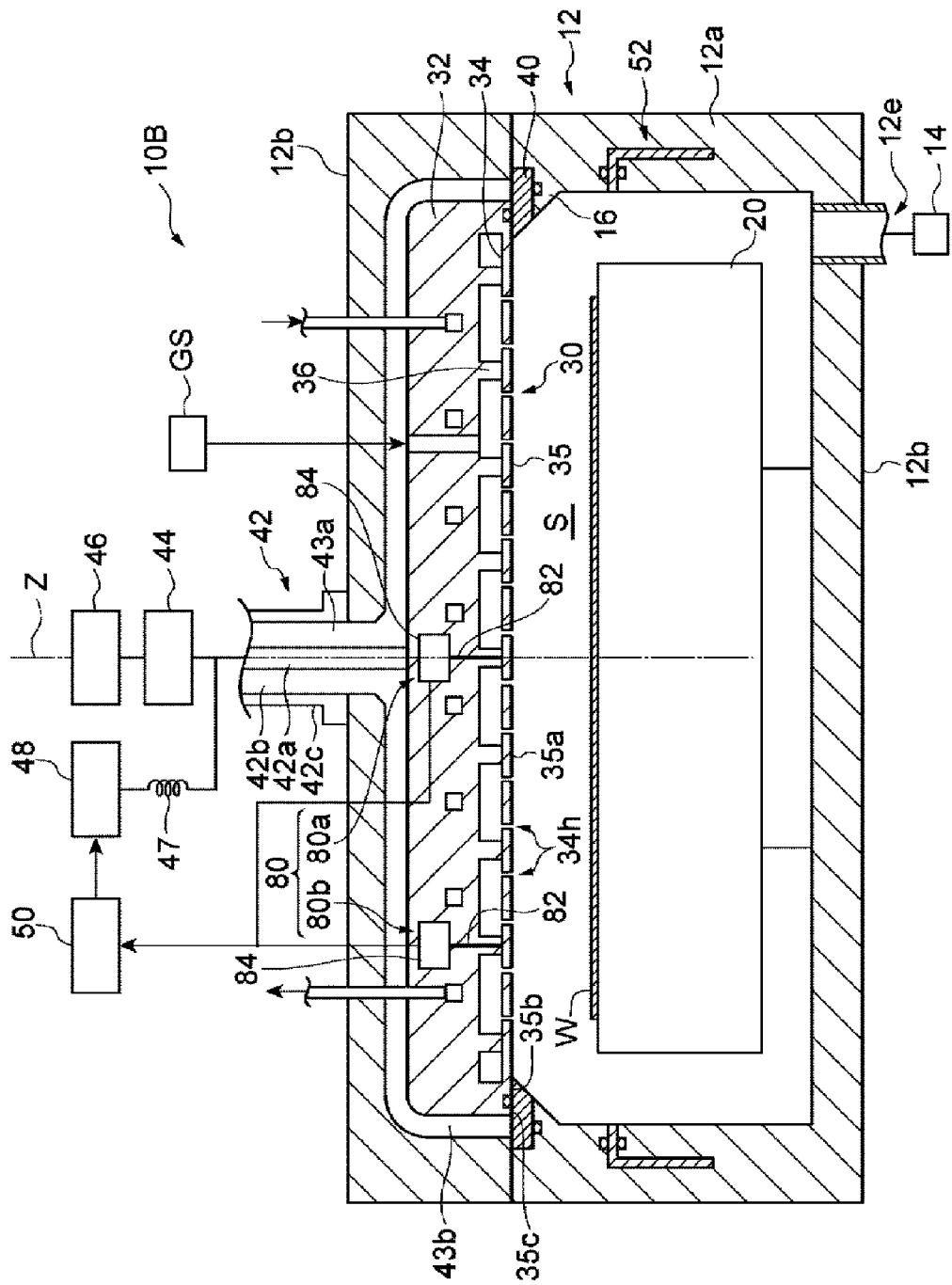
FIG. 4 is a vertical cross-sectional view of a plasma treatment device according to another embodiment.

Next, a plasma treatment device according to another embodiment will be described. A plasma treatment device 10B illustrated in FIG. 4 includes a plurality of sensors 80 that are different from the plurality of sensors 60. Hereinafter, the plasma treatment device 10B will be described with a focus on the differences from the plasma treatment device 10A illustrated in FIG. 1, and redundant descriptions thereof will be omitted.

The plurality of sensors 80 is provided at different positions in the radial direction of the upper electrode 30, respectively. In the embodiment illustrated in FIG. 4, two sensors 80a and 80b as the plurality of sensors 80 are provided in the upper electrode 30. The sensor 80a is provided at the center position of the upper electrode 30 in the radial direction, namely on the central axis Z. The sensor 80b is provided radially outward of the sensor 80a. Each of the sensor 80a and the sensor 80b includes a thermocouple 82 and a voltage measurement circuit 84. The thermocouple 82 has one end and the other end, and generates a voltage corresponding to a difference in temperature between the one end and the other end. The one end of the thermocouple 82 is in contact with the shower plate 34. The other end of the thermocouple 82 is disposed inside the main body 32. The voltage measurement circuit 84 is electrically connected to the thermocouple 82, and acquires a voltage generated in the thermocouple 82. The voltage acquired by the voltage measurement circuit 84 is sent to the control part 50. The control part 50 controls the second high-frequency waves or the DC bias voltage to be provided from the bias power supply 48 on the basis of the output from the voltage measurement circuit 84.

For example, when the output voltage from the sensor 80a is higher than that from the sensor 80b, the control part 50 estimates that the density of plasma generated radially inward of the space S is higher than the density of plasma generated radially outward of the space S. Therefore, in this case, the control part 50 controls the bias power supply 48 such that the absolute value of the negative bias voltage to be applied to the upper electrode 30 from the bias power supply 48 becomes smaller. As a result, the sheath becomes thinner and the attenuation coefficient of the surface waves is increased. Thus, the surface waves supplied from the outer edge 35c of the surface 35, the ratio of energy of the surface waves reaching the center position of the surface 35 in the radial direction becomes smaller. As a result, the density of plasma generated radially inward of the space S is decreased, thus improving the in-plane uniformity of plasma density. In contrast, when the output voltage from the sensor 80a is lower than that from the sensor 80b, the control part 50 estimates that the density of plasma generated radially inward of the space S is lower than the density of plasma generated radially outward of the space S. Therefore, in this case, the control part 50 controls the bias power supply 48 such that the absolute value of the negative bias voltage to be applied to the upper electrode 30 from the bias power supply 48 becomes larger. As a result, the sheath becomes thicker and the attenuation coefficient of the surface waves is decreased. Thus, among the surface waves supplied from the outer edge 35c of the surface 35, the ratio of energy of the surface waves reaching the center position of the surface 35 in the radial direction becomes larger. As a result, the density of plasma generated radially inward of the space S is increased, thus improving the in-plane uniformity of plasma density.

The plasma treatment device 10B also has the same actions and effects as the plasma treatment device 10A. That is to say, the plasma treatment device 10B is able to detect the density distribution of plasma generated in the space S on the basis of the output provided from the plurality of sensors 80. The density distribution of plasma can be controlled by controlling the bias voltage to be applied to the upper electrode 30 depending on the outputs provided from the plurality of sensors 80.

Figure 5:
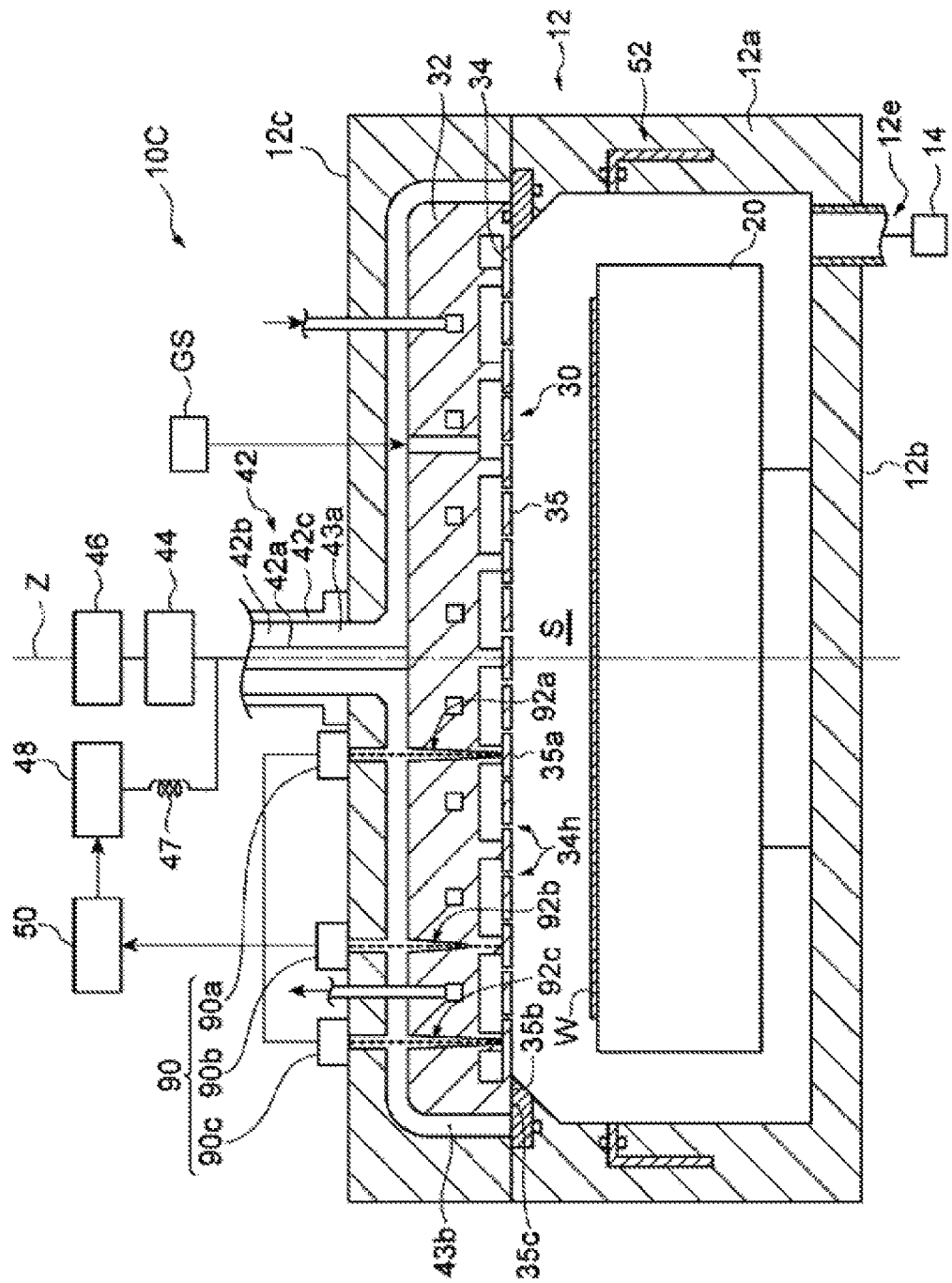
FIG. 5 is a vertical cross-sectional view of a plasma treatment device according to another embodiment.

Next, a plasma treatment device according to another embodiment will be described. A plasma treatment device 10C illustrated in FIG. 5 includes a plurality of sensors 90 instead of the plurality of sensors 60. Hereinafter, the plasma treatment device 10C will be described with a focus on the differences from the plasma treatment device 10A illustrated in FIG. 1 and redundant descriptions thereof will be omitted.

The plurality of sensors 90 is provided at different positions in the radial direction of the upper electrode 30, respectively. In the embodiment illustrated in FIG. 5, three sensors 90a, 90b, and 90c as the plurality of sensors 90 are connected to the upper electrode 30. The sensor 90a is provided in the vicinity of the center position of the upper electrode 30 in the radial direction, namely in the vicinity of the central axis Z. The sensor 90c is provided radially outward of the sensor 90a. The sensor 90b is provided at a position between the sensor 90a and the sensor 90c in the radial direction of the upper electrode 30. Each of the plurality of sensors 90a, 90b, and 90c is a radiation thermometer that detects a temperature of an object on the basis of heat (infrared rays) radiated from the object.

In the present embodiment, holes 92a, 92b, and 92c are formed at positions corresponding to the sensors 90a, 90b, and 90c of the main body 32 in the lid portion 12c, respectively. The hole 92a and the hole 92c are formed to extend from the upper surface of the lid portion 12c to the shower plate 34 along a direction parallel to the central axis Z. The hole 92b is formed to extend from the upper surface of the lid portion 12c to the interior of the main body 32 along a direction parallel to the central axis Z.

Each of the sensors 90a and 90c detects a temperature of the shower plate 34 on the basis of radiant heat acquired through the respective holes 92a and 92c. The sensor 90b detects a temperature of the main body 32 on the basis of radiant heat acquired through the hole 92b. The sensors 90a, 90b and 90c send the detected temperatures of the shower plate 34 and the main body 32 to the control part 50, respectively. The control part 50 calculates a temperature difference between the temperature of the shower plate 34 detected by the sensor 90a and the temperature of the main body 32 detected by the sensor 90b, and a temperature difference between the temperature of the shower plate 34 detected by the sensor 90c and the temperature of the main body 32 detected by the sensor 90b. On the basis of two temperature differences thus calculated, the control part 50 controls the second high-frequency waves or the DC bias voltage to be provided from the bias power supply 48.

For example, when the temperature difference between the temperature of the shower plate 34 detected by the sensor 90a and the temperature of the main body 32 detected by the sensor 90b is larger than the temperature difference between the temperature of the shower plate 34 detected by the sensor 90c and the temperature of the main body 32 sensed by the sensor 90b, the control part 50 estimates that plasma generated radially inward of the space S has a density higher than that of plasma generated radially outward of the space S. Therefore, in this case, the control part 50 controls the bias power supply 48 such that the absolute value of the negative bias voltage to be applied to the upper electrode 30 from the bias power supply 48 becomes smaller. As a result, the sheath becomes thinner and the attenuation coefficient of the surface waves is increased. Therefore, among the surface waves supplied from the outer edge 35c of the surface 35, the ratio of energy of the surface waves reaching the center position of the surface 35 in the radial direction becomes smaller. As a result, the density of plasma generated radially inward of the space S is decreased, thus improving the in-plane uniformity of plasma density. In contrast, when the temperature difference between the temperature of the shower plate 34 detected by the sensor 90a and the temperature of the main body 32 detected by the sensor 90b is smaller than the temperature difference between the temperature of the shower plate 34 detected by the sensor 90c and the temperature of the main body 32 sensed by the sensor 90b, the control part 50 estimates that plasma generated radially outward of the space S has a density higher than that of plasma generated radially inward of the space S. Therefore, in this case, the control part 50 controls the bias power supply 48 such that the absolute value of the negative bias voltage to be applied to the upper electrode 30 from the bias power supply 48 becomes larger. As a result, the sheath becomes thicker and the attenuation coefficient of the surface waves is decreased. Thus, among the surface waves supplied from the outer edge 35c of the surface 35, the ratio of energy of the surface waves reaching the center position of the surface 35 in the radial direction becomes larger. As a result, the density of plasma generated radially inward of the space S is increased, thus improving the in-plane uniformity of plasma density.

The plasma treatment device 10C also has the same actions and effects as the plasma treatment device 10A. That is to say, the plasma treatment device 10C is able to detect the density distribution of plasma generated in the space S on the basis of the outputs provided from the plurality of sensors 90. By controlling the bias voltage to be applied to the upper electrode 30 depending on the outputs provided from the plurality of sensors 90, it is possible to control the density distribution of plasma.

Hereinafter, the present disclosure will be described in more detail with exemplary embodiments, but is not limited thereto.

Figure 6:
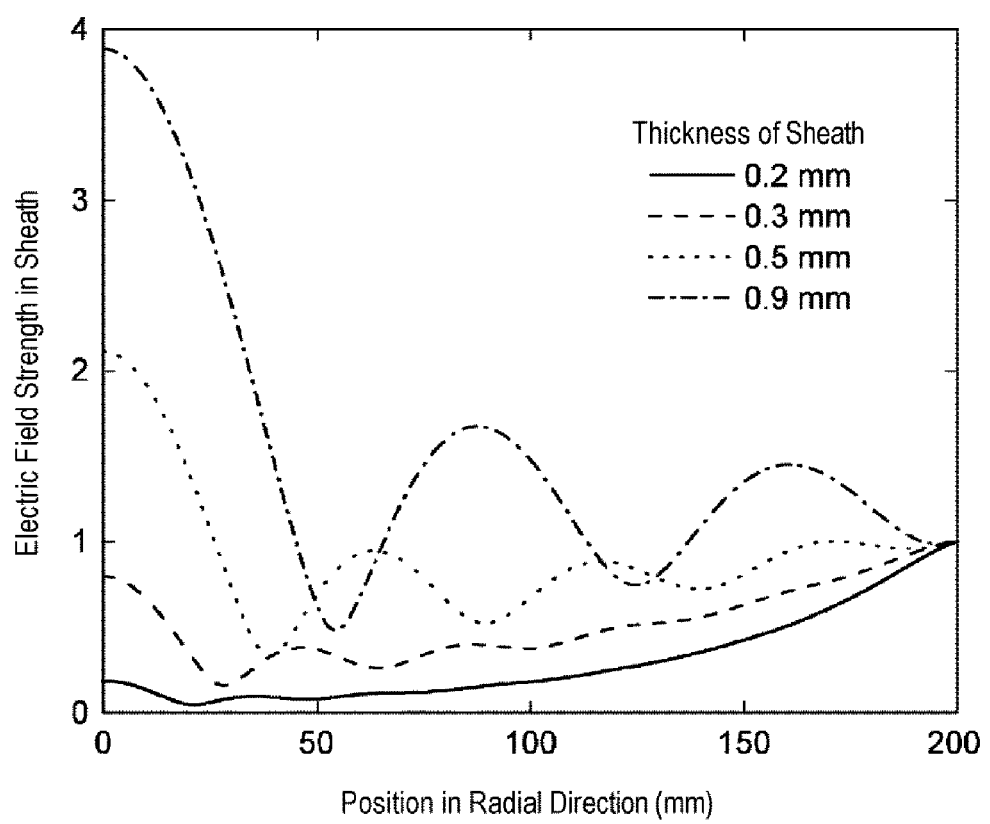
FIG. 6 is a simulation result showing the relationship between the thickness of a sheath and the distribution of electric field strength in the sheath.

When plasma was generated in the space S using the plasma treatment device 10A illustrated in FIG. 1, the distribution of electric field strength of sheath waves propagating from the outer edge 35c of the upper electrode 30 towards the center of the surface 35 along the sheath was calculated through a simulation. The radius of the surface 35 was 200 mm. The frequency of the first high-frequency waves applied from the high-frequency power supply 46 to the upper electrode 30 was 500 MHz. The relative dielectric constant of plasma was set to minus 50, and the dielectric loss of plasma was set to minus 0.3. FIG. 6 is a simulation result showing the distribution of electric field strength in the sheath, which is obtained when changing the thickness of the sheath to 0.2 mm, 0.3 mm, 0.5 mm, and 0.9 mm. The position of 0 mm on the horizontal axis in FIG. 6 corresponds to the center position of the surface 35 in the radial direction, and the position of 200 mm corresponds to the position of the outer edge 35c of the surface 35.

As illustrated in FIG. 6, when the thickness of the sheath was 0.2 mm, it was confirmed that the electric field strength in the sheath is increased from the inner side to the outer side of the surface 35 in the radial direction. In this state, plasma was generated with density deviation in which the density at the inner side of the space S in the radial direction is low and the density at the outer side of the space S in the radial direction is high. Meanwhile, it was confirmed that the electric field strength at the inner side of the surface 35 in the radial direction becomes larger than the electric field strength at the outer side of the surface 35 in the radial direction as the thickness of the sheath increases. In particular, when the thickness of the sheath was 0.9 mm, the electric field strength at the center of the surface 35 in the radial direction was four times that at the outer edge 35c of the surface 35. In this case, plasma was generated with density deviation in which the density at the inner side of the space S in the radial direction is high and density at the outer side of the space S in the radial direction is low. From the results shown in FIG. 6, it was confirmed that it is possible to control the density distribution of plasma in the radial direction by controlling the thickness of the sheath by the bias voltage.

In addition, as shown in FIG. 6, it was confirmed that the electric field strength in the sheath fluctuates with a predetermined cycle in the radial direction. The reason why the fluctuation of the electric field strength occurs is that the sheath waves propagating while being attenuated from the outer side toward the inner side of the surface 35 in the radial direction and the sheath waves propagating from the outer side to the inner side of the surface 35 in the radial direction interfere with each other, thus forming standing waves.

Further, it was confirmed that as the sheath becomes thicker, the degree of fluctuation of the electric field strength becomes larger and the cycle of fluctuation becomes larger. When the sheath is thin, the great majority of energy of the sheath waves is present in the plasma. As such, the majority of energy of the sheath waves is attenuated and lost during propagation of the sheath waves. This makes it difficult for a lot of standing waves to be generated. Thus, it is presumed that the fluctuation of the electric field strength is reduced. Further, when the sheath is thin, it is presumed that the wavelength of sheath waves is short and the cycle of fluctuation becomes shorter. In contrast, when the sheath is thick, the percentage of energy of the sheath waves existing in plasma is relatively small. This makes it difficult for energy to be lost by attenuation during the propagation of the sheath waves. Thus, a lot of standing waves are likely to be generated such that the fluctuation of the electric field strength is increased. When the sheath is thick, the wavelength of sheath waves becomes longer and the cycle of the fluctuation also becomes longer. As shown in FIG. 6, unevenness occurs in the density distribution of plasma due to the generation of the standing waves. However, since the plasma diffuses until it reaches just above the workpiece W, uniformity of processing is kept to some extent.

Figure 7:
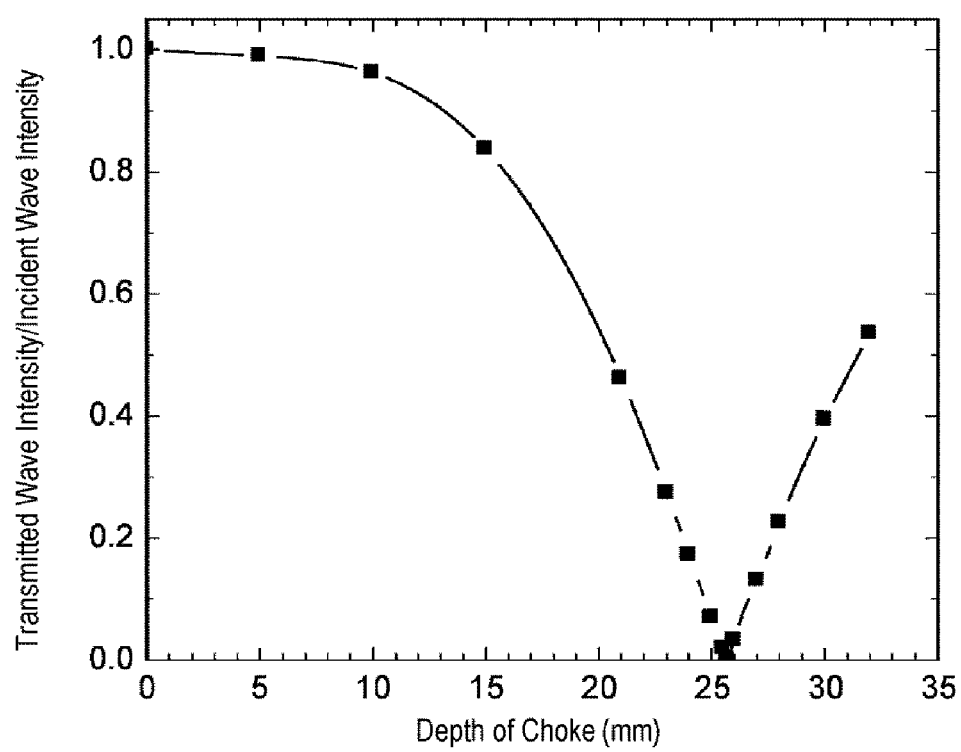
FIG. 7 is a simulation result showing the relationship between the length of a choke part and the intensity of transmitted waves.

In addition, a study was conducted on the effect of the choke part 52. FIG. 7 represents a simulation result showing the relationship between a length of the choke part 52 and a ratio of the intensity of transmitted waves to the intensity of incident waves. In this simulation, the frequency of the first high-frequency waves provided from the high-frequency power supply 46 was set to 1 GHz, and the material of the choke part 52 was alumina (relative dielectric constant: 9.8). Here, the wavelength $\lambda_g$ of the electromagnetic waves propagating in the choke part 52 is expressed by Equation 1 as follows.

$$\lambda_g = \lambda_0 / \sqrt{\varepsilon_r \mu_r}$$ [Equation 1]

In Equation 1, $\lambda_0$ is the wavelength of electromagnetic waves propagating in a vacuum, $\varepsilon_r$ is the relative dielectric constant of alumina constituting the choke part 52, and $\mu_r$ is the relative permeability of alumina constituting the choke part 52. When the frequency of the first high-frequency waves is 1 GHz, $\lambda_0$ is 300 mm Thus, the length of ¼ of $\lambda_g$ is 24.0 mm. As shown in FIG. 7, it was confirmed that when the length of the choke part 52 is set to about 24.0 mm, the intensity of transmitted waves transmitted through the choke part 52 becomes smaller, so that electromagnetic waves can be suppressed. The length of the choke part 52 at which the intensity of the transmitted waves is minimal was 25.7 mm, which is slightly longer than 24.0 mm. The reason for this is because the position of the end surface of the choke part 52 does not coincide with the position of the electrical short-circuit point.

The plasma treatment device according to an embodiment has been described above, but not limited thereto and various modifications may be made to the above embodiments without departing from the spirit of the present disclosure. For example, in the above-described plasma treatment device, the first high-frequency waves provided from the high-frequency power supply 46 and the second high-frequency waves or the DC bias voltage provided from the bias power supply 48 has been described to be applied to the upper electrode 30 via the inner conductor 42a. However, the second high-frequency waves or the DC bias voltage may be applied to the upper electrode 30 via a conductor different from the inner conductor 42a, namely a path different from that of the first high-frequency waves.

EXPLANATION OF REFERENCE NUMERALS 10A, 10B, 10C: plasma treatment device, 12: chamber body, 12a: sidewall, 16: supporting portion, 20: stage, 30: upper electrode, 32: main body, 34: shower plate, 35: surface, 35a: inner portion, 35b: outer portion, 35c: outer edge, 40: insulating ring, 42: coaxial waveguide, 42a: inner conductor, 42b: waveguide, 42c: outer conductor, 43a: first portion of waveguide, 43b: second portion of waveguide, 46: high-frequency power supply, 48: bias power supply, 50: control part, 52: choke part, 52a: first portion of choke part, 52b: second portion of choke part, 60, 80, 90: sensor, GS: gas supply part, S: space, W: workpiece, Z: central axis

The invention claimed is:

1. A plasma treatment device comprising:
    a chamber body including a chamber defined therein;
    a gas supply part configured to supply a processing gas into the chamber;
    a stage disposed within the chamber;
    an upper electrode having a circular surface that faces the stage via an internal space of the chamber;
    a conductor connected to the upper electrode;
    a high-frequency power supply configured to generate a first high-frequency power having a frequency ranging from 100 MHz to 1,000 MHz, the high-frequency power supply being coupled to the upper electrode via the conductor;
    a bias power supply configured to apply a second high-frequency power or a direct current bias power to the upper electrode, the second high-frequency power having a frequency lower than a frequency of the first high-frequency power;
    an annular insulating ring provided to extend along an outer edge of the circular surface of the upper electrode;
    a waveguide through which electromagnetic waves generated around the conductor based on the first high-frequency power propagate, the waveguide being connected to the annular insulating ring outside the upper electrode; and
    a controller configured to control the second high-frequency power or the direct current bias power to be applied to the upper electrode,
    wherein a plurality of sensors configured to detect parameters corresponding to heat fluxes directed toward the upper electrode from the internal space are provided in the upper electrode,
    wherein the plurality of sensors are disposed at different positions in the upper electrode in a radial direction of the upper electrode, respectively,
    wherein the controller is further configured to control the bias power supply to increase or decrease an absolute value of a negative bias voltage applied to the upper electrode from the bias power supply, based on detection results obtained by the plurality of sensors,
    wherein the upper electrode includes:
        a main body having a coolant flow path formed therein; and
        a shower plate disposed under the main body and having an annular surface, the shower plate having a plurality of gas discharge holes formed therein,
    wherein each of the plurality of sensors is configured to output an output signal corresponding to a difference between a temperature of the main body and a temperature of the shower plate,
    wherein the controller is further configured to control the second high-frequency power or the direct current bias power based on the output signal, and
    wherein each of the plurality of sensors includes a first electrode which is in contact with the shower plate and a second electrode which is in contact with the main body, and outputs a voltage corresponding to a difference in temperature between the first electrode and the second electrode.

2. A plasma treatment device comprising:
a chamber body including a chamber defined therein;
a gas supply part configured to supply a processing gas into the chamber;
a stage disposed within the chamber;
an upper electrode having a circular surface that faces the stage via an internal space of the chamber;
a conductor connected to the upper electrode;
a high-frequency power supply configured to generate a first high-frequency power having a frequency ranging from 100 MHz to 1,000 MHz, the high-frequency power supply being coupled to the upper electrode via the conductor;
a bias power supply configured to apply a second high-frequency power or a direct current bias power to the upper electrode, the second high-frequency power having a frequency lower than a frequency of the first high-frequency power;
an annular insulating ring provided to extend along an outer edge of the circular surface of the upper electrode;
a waveguide through which electromagnetic waves generated around the conductor based on the first high-frequency power propagate, the waveguide being connected to the annular insulating ring outside the upper electrode; and
a controller configured to control the second high-frequency power or the direct current bias power to be applied to the upper electrode,
wherein a plurality of sensors configured to detect parameters corresponding to heat fluxes directed toward the upper electrode from the internal space are provided in the upper electrode,
wherein the plurality of sensors are disposed at different positions, respectively, in the upper electrode in a radial direction of the upper electrode,
wherein the controller is further configured to control the bias power supply to increase or decrease an absolute value of a negative bias voltage applied to the upper electrode from the bias power supply, based on detection results obtained by the plurality of sensors,
wherein the plurality of sensors include a first sensor provided at a center portion of the upper electrode in the radial direction and a second sensor provided radially outward of the first sensor; and
wherein the controller is further configured to control the bias power supply to:
decrease the absolute value of the negative bias voltage, when an output voltage of the first sensor is higher than an output voltage of the second sensor; and
increase the absolute value of the negative bias voltage, when the output voltage of the first sensor is lower than the output voltage of the second sensor.

* * * * *

UNITED STATES PATENT AND TRADEMARK OFFICE
CERTIFICATE OF CORRECTION

| | | |
|---|---|---|
| PATENT NO. | : 11,443,927 B2 | Page 1 of 1 |
| APPLICATION NO. | : 16/464812 | |
| DATED | : September 13, 2022 | |
| INVENTOR(S) | : Masaki Hirayama | |

It is certified that error appears in the above-identified patent and that said Letters Patent is hereby corrected as shown below:

On the Title Page

In addition to the first Assignee "TOKYO ELECRON LIMITED", please add the second Assignee "TOHOKU UNIVERSITY Miyagi, Japan".

Signed and Sealed this
Eighth Day of October, 2024

Katherine Kelly Vidal
*Director of the United States Patent and Trademark Office*